(12) United States Patent
Kishi et al.

(10) Patent No.: US 12,267,945 B2
(45) Date of Patent: Apr. 1, 2025

(54) ELECTRONIC COMPONENT PROTECTION STRUCTURE AND SWITCH DEVICE

(71) Applicant: TOYO DENSO KABUSHIKI KAISHA, Tokyo (JP)

(72) Inventors: Shoji Kishi, Tsurugashima (JP); Kohei Tajima, Tsurugashima (JP); Toshihiro Namikawa, Tsurugashima (JP); Hideaki Ito, Tsurugashima (JP)

(73) Assignee: TOYO DENSO KABUSHIKI KAISHA, Tokyo (JP)

( * ) Notice: Subject to any disclaimer, the term of this patent is extended or adjusted under 35 U.S.C. 154(b) by 181 days.

(21) Appl. No.: 18/101,707

(22) Filed: Jan. 26, 2023

(65) Prior Publication Data

US 2023/0292429 A1    Sep. 14, 2023

(30) Foreign Application Priority Data

Mar. 10, 2022   (JP) ................. 2022-037110

(51) Int. Cl.
*H05K 1/02* (2006.01)
*H05K 1/18* (2006.01)

(52) U.S. Cl.
CPC ........... *H05K 1/0213* (2013.01); *H05K 1/181* (2013.01)

(58) Field of Classification Search
CPC ............................ H05K 1/0213; H05K 1/181

USPC .......................................................... 361/760
See application file for complete search history.

(56) References Cited

U.S. PATENT DOCUMENTS

| | | | |
|---|---|---|---|
| 6,466,454 B1 * | 10/2002 | Jitaru | H01F 27/06 361/767 |
| 6,912,134 B2 * | 6/2005 | Grant | H05K 7/20209 361/813 |
| 2010/0003788 A1 * | 1/2010 | Wang | H05K 1/0206 438/118 |
| 2017/0263902 A1 * | 9/2017 | Hwang | H01M 50/24 |
| 2021/0076510 A1 * | 3/2021 | Chen | H05K 3/284 |

FOREIGN PATENT DOCUMENTS

| | | |
|---|---|---|
| JP | 62-20428 U | 2/1987 |
| JP | 2015-175235 A | 10/2015 |

* cited by examiner

*Primary Examiner* — Andargie M Aychillhum
(74) *Attorney, Agent, or Firm* — Keating & Bennett, LLP

(57) ABSTRACT

An electronic component protection structure and a switch device capable of protecting an electronic component from static electricity charged on or within a case member are achieved with a simple configuration. An electronic component protection structure includes a circuit board on which an electronic component is mounted, a base member supporting the circuit board, a case member covering the circuit board and fixed to the base member, and a conductive ground member connected to the circuit board. The ground member includes an exposed portion at least a part of which is exposed to the inside of the case member.

10 Claims, 11 Drawing Sheets

ELECTRONIC COMPONENT PROTECTION STRUCTURE AND SWITCH DEVICE

BACKGROUND OF THE INVENTION

Field of the Invention

The present invention relates to electronic component protection structures and switch devices.

Description of the Related Art

Electronic devices each including a circuit board on which an electronic component such as an IC is mounted are known. Some of such electronic devices have a protection structure for protecting an electronic component from static electricity. As an example of a device having such a protection structure, Japanese Laid-open Patent Publication (Kokai) No. 2015-175235 discloses a device including an electric-motor housing to which a circuit board (control board) is fixed, and a controller cover which covers the circuit board. In this device, the controller cover is secured to the electric-motor housing by a fixing bolt fastened to an insert nut molded and buried in the electric-motor housing. The device further includes a ground terminal forming body molded and buried in the electric-motor housing, and a cover-side terminal of the ground terminal forming body is electrically connected to the fixing bolt via the insert nut. When static electricity is charged on or within the controller cover, the static electricity is released to an automobile body through the fixing bolt, the insert nut, and the ground terminal forming body in this order. As another example, Japanese Utility Model Application Laid-Open No. S62-20428 discloses a device including an operation unit, which is a membrane switch, and a circuit board including a connector to which the operation unit is connected. In this device, a conductive pattern for electrostatic grounding is formed on the circuit board and is electrically connected to a terminal of the connector. The static electricity charged on or within the operation unit is released through the conductive pattern for electrostatic grounding.

The device described in Japanese Laid-open Patent Publication (Kokai) No. 2015-175235 has a protection structure including the fixing bolt, the insert nut, and the ground terminal forming body, and thus the device has a relatively large number of parts. In addition, the shape of the ground terminal forming body tends to be complex. In the device described in Japanese Utility Model Application Laid-Open No. S62-20428, the conductive pattern for electrostatic grounding is formed on the circuit board, and thus the circuit board tends to increase in size and complexity.

SUMMARY OF THE INVENTION

One or more aspects of the present invention are directed to an electronic component protection structure and a switch device that are capable of protecting an electronic component from static electricity charged on or within a case member with a simple configuration.

An electronic component protection structure according to one aspect includes a circuit board on which an electronic component is mounted, a base member supporting the circuit board, a case member covering the circuit board and fixed to the base member, and a conductive ground member connected to the circuit board. The ground member includes an exposed portion at least a part of which is exposed to the inside of the case member.

A switch device according to another aspect includes an operation body being movable in a reciprocating manner in at least one direction, and the electronic component protection structure. The electronic component on the circuit board is configured to detect movement of the operation body and output a detection result.

According to the above configuration, the electronic component can be protected from static electricity charged on or within the case member with a simple configuration.

Further features of the present invention will become apparent from the following description of exemplary embodiments with reference to the attached drawings.

DESCRIPTION OF THE EMBODIMENTS

Figure 1:
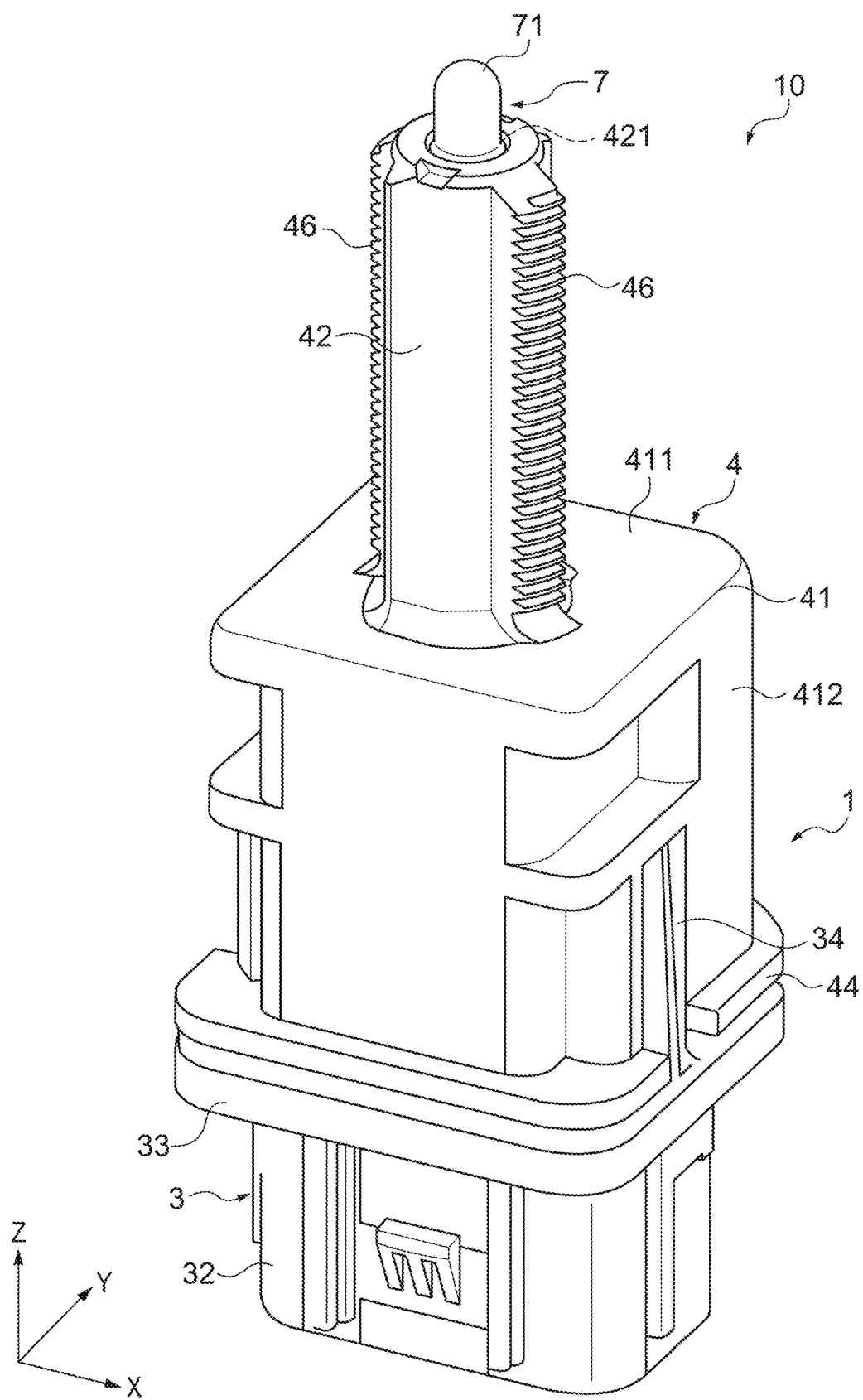
FIG. 1 is a perspective view illustrating a switch device including an electronic component protection structure according to a first embodiment.

Hereinafter, embodiments of the present invention will be described in detail with reference to the drawings. However, configurations described in the following embodiments are merely examples, and the scope of the present invention is not limited by the configurations described in the embodiments. It should be noted that an X axis, a Y axis, and a Z axis orthogonal to each other are indicated in the drawings. The X-axis direction is a direction parallel to the width of a switch device. The Y-axis direction is a direction parallel to the depth of the switch device. The Z-axis direction is a direction parallel to the height of the switch device. Further, a direction toward which an arrow of each axis is directed is referred to as a "positive side", and the opposite direction is referred to as a "negative side". The positive side in the Z axis direction may be referred to as "upper (or upward)", and the negative side in the Z axis direction may be referred to as "lower (or downward)".

First Embodiment

A first embodiment will be described below with reference to FIGS. 1 to 7. A switch device 10 illustrated in FIG. 1 includes an electronic component protection structure 1. The switch device 10 may be installed in, but not limited to, an automobile. For example, the switch device 10 is installed near the base of a pedal (which is not illustrated) like a brake pedal or a clutch pedal of an automobile. The switch device 10 is configured to, when the pedal is depressed, detect the depression of the pedal and electrically output the detected result. It should be noted that the switch device 10 may electrically output the amount of pedal depression.

Figure 2:
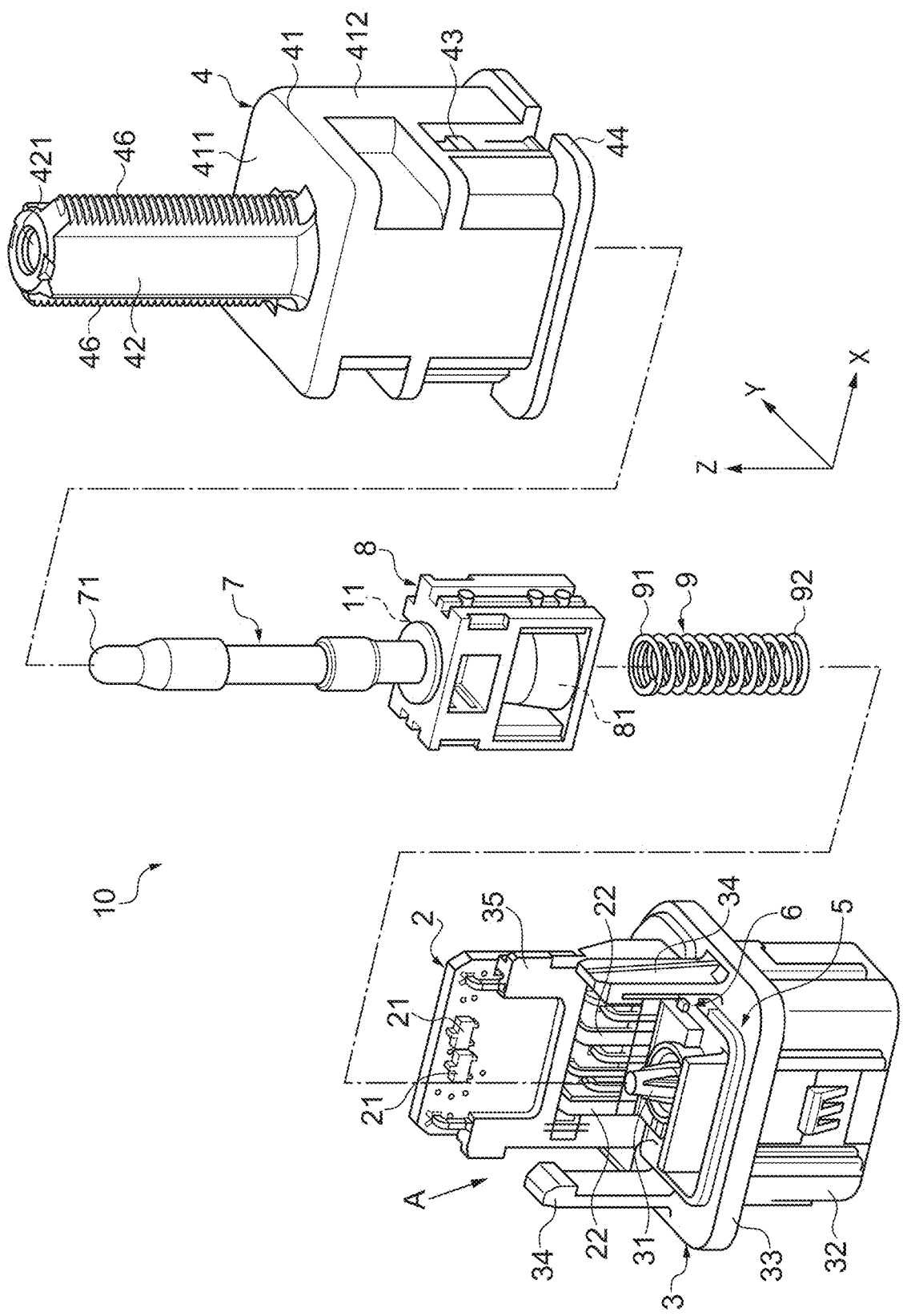
FIG. 2 is an exploded perspective view of the switch device illustrated in FIG. 1.

As illustrated in FIG. 2, the electronic component protection structure 1 includes a circuit board 2, a base member 3, a case member 4, a sealing member 5, and a ground member 6. As well as the electronic component protection structure 1, the switch device 10 includes a rod 7, a magnet holder 8, a coil spring 9, and a magnet 11. The rod 7, the magnet holder 8, the coil spring 9, and the magnet 11 will be described before the electronic component protection structure 1 is described.

The rod 7 (operation body) is a columnar member extending along the Z-axis direction, and is supported to be movable in a reciprocating manner in the Z-axis direction. The upper end portion (distal end portion) of the rod 7 protrudes from the distal end opening portion 421 of the case member 4 (see FIG. 1). The upper end surface 71 of the rod 7 is rounded in a hemispherical shape and abuts against a predetermined member constituting the pedal. When the pedal is operated by a driver of the automobile depressing the pedal, the rod 7 moves upward by urging force of the coil spring 9. When the depressing force from the driver is released, the rod 7 is pressed downward against the urging force of the coil spring 9.

The magnet holder 8 is disposed below the rod 7. As a result, the magnet holder 8 reciprocates in the Z-axis direction together with the rod 7. The magnet holder 8 has a block shape, and holds the magnet 11 on the positive side thereof in the Y-axis direction.

The coil spring 9 is disposed below the magnet holder 8. The coil spring 9 stands compressed between the magnet holder 8 and the base member 3, which urges the rod 7 upward. The upper end 91 of the coil spring 9 is inserted into the recess 81 of the magnet holder 8, and the protrusion 31 of the base member 3 is inserted into the lower end 92 of the coil spring 9, which regulates the position and posture of the coil spring 9, and allows the coil spring 9 to stably expand and contract in the Z-axis direction.

It should be noted that the relationship between the depression of the pedal and the movement of the rod 7 may be reversed from the relationship in the present embodiment.

The electronic component protection structure 1 includes the circuit board 2, the base member 3, the case member 4, the sealing member 5, and the ground member 6, so as to protect an electronic component 21 of the circuit board 2.

Figure 3:
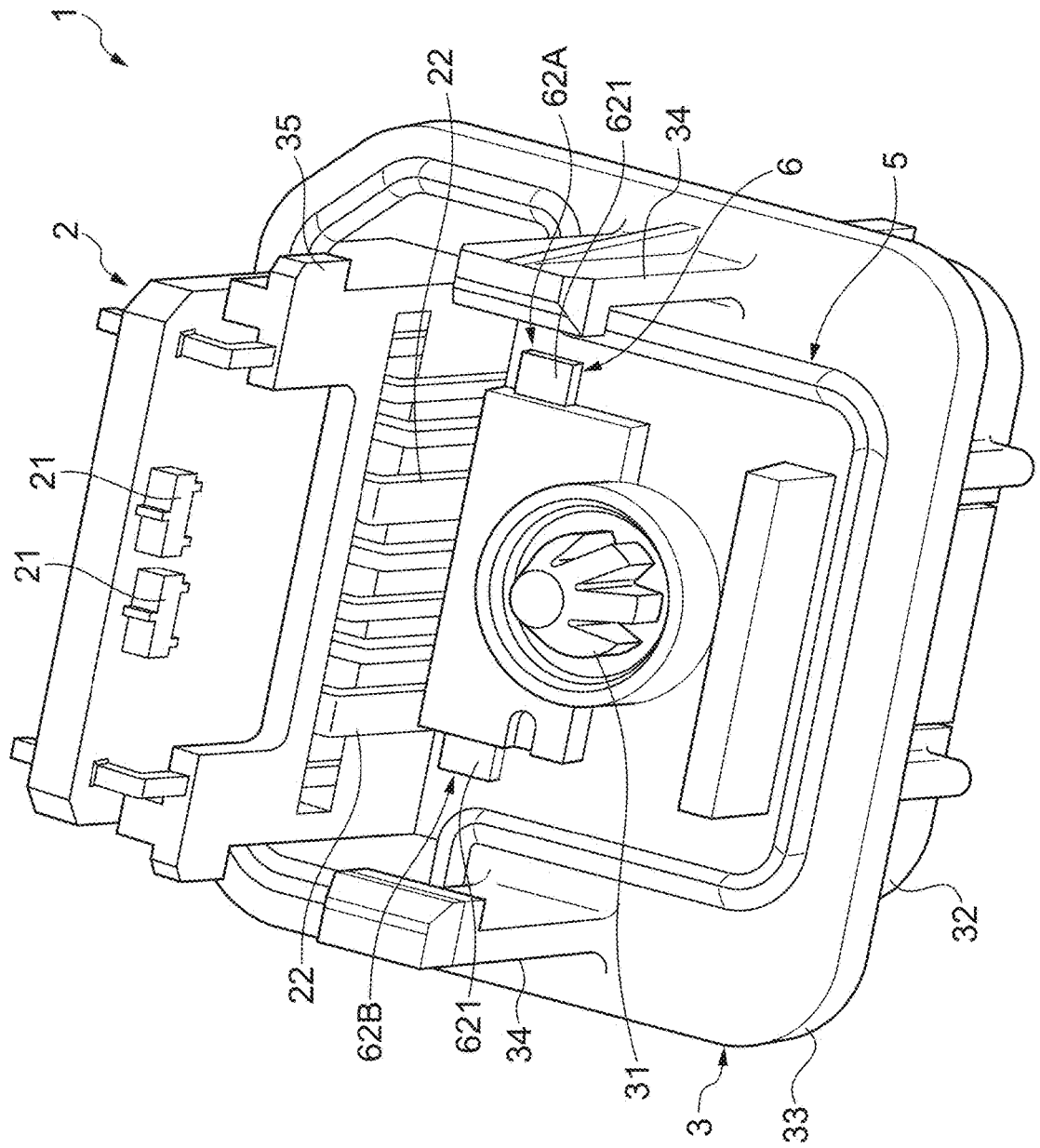
FIG. 3 is a partial view of the electronic component protection structure as viewed from a direction of an arrow A in FIG. 2.

FIG. 3 is a partial view of the electronic component protection structure 1 as viewed from a direction of the arrow A in FIG. 2. As illustrated in FIG. 3, the circuit board 2 is supported by the base member 3 such that the thickness direction of the circuit board 2 is parallel to the Y-axis direction. One or more electronic components 21 are mounted on at least one surface of the circuit board 2. Examples of the electronic component 21 include an integrated circuit (IC) and a Hall element. The Hall element is a magnetic sensor using the Hall effect. The positional relationship between the Hall element and the magnet 11 held by the magnet holder 8 changes when the rod 7 moves in a reciprocating manner as the pedal is depressed. According to the change, a voltage is generated in the Hall element. The Hall element detects the voltage as the depression amount of the pedal and outputs the depression amount. That is, the electronic component 21 detects the movement of the rod 7, which is an operation body movable in a reciprocating manner in at least one direction, and converts the movement into an electrical output as a detection result.

Figure 4:
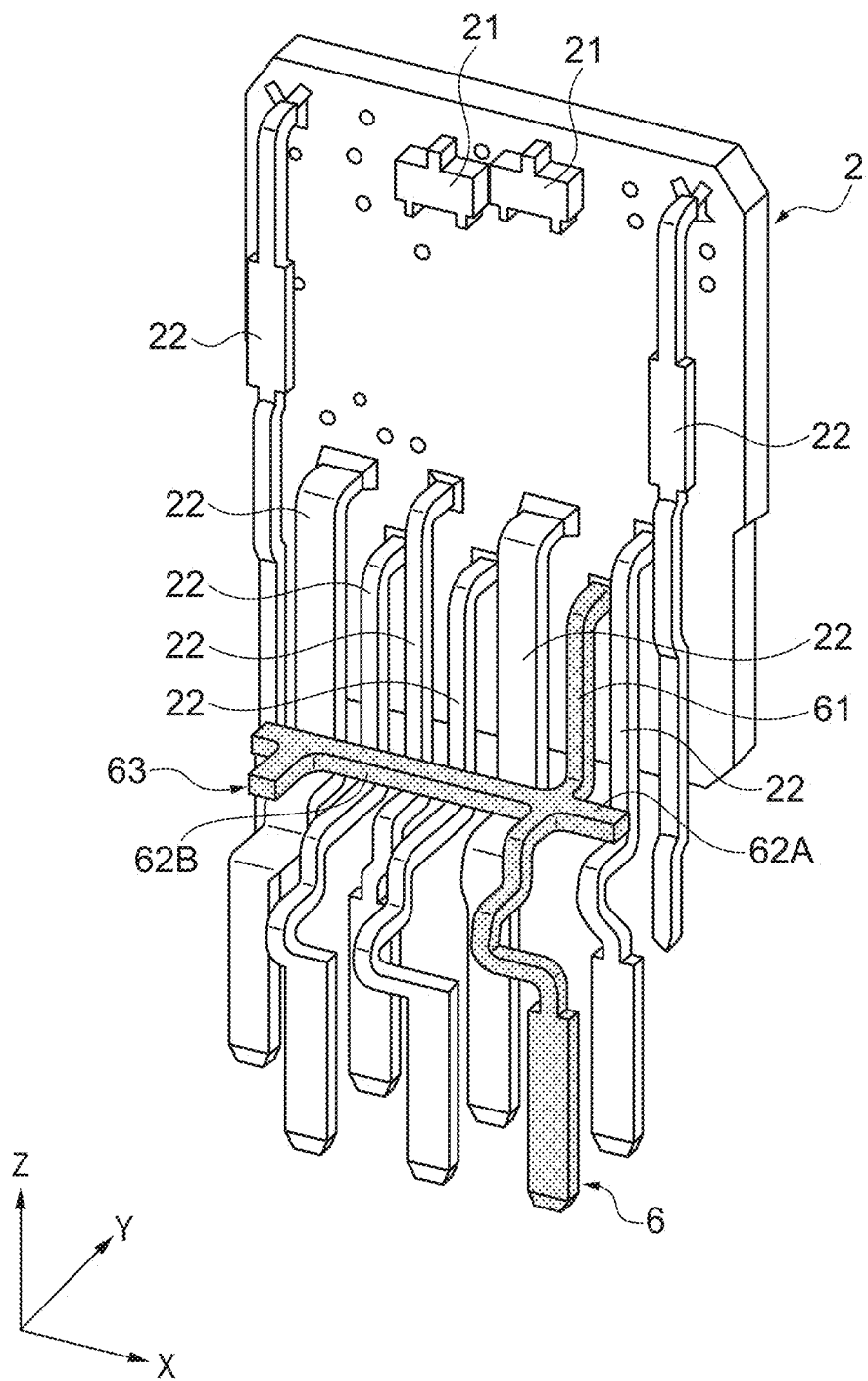
FIG. 4 is a perspective view of a circuit board and a ground member illustrated in FIG. 2.

As illustrated in FIG. 4, a plurality of terminals 22 are connected to the circuit board 2. The terminals 22 are electrically connected to respective electronic components 21 via a circuit pattern (which is not illustrated). The terminals 22 extend downward as a whole.

As illustrated in FIGS. 2 and 3, the base member 3 includes a hollow body portion 32, a pair of claw portions 34 protruding from the body portion 32, and a support portion 35 protruding from the body portion 32 and supporting the circuit board 2. The body portion 32, the claw portions 34, and the support portion 35 are integrally formed. The base member 3 is made of one or more of various resin materials such as polybutylene terephthalate (PBT), which allows the base member 3 to be easily molded by using a mold when the base member 3 is manufactured.

Terminals 22 extending from the circuit board 2 are exposed to the inside (in other words, exposed to the inner space) of the body portion 32, and the body portion 32 works as a connector housing that supports and fixes the terminals 22. The body portion 32 is configured such that an external connector (which is not illustrated) is inserted into the body portion 32, which allows a terminal of the external connector to be electrically connected with the corresponding terminal 22.

A flange portion 33 is formed to protrude from an outer periphery of the body portion 32. The pair of claw portions 34 is formed to protrude upward from the flange portion 33. These claw portions 34 are disposed apart from each other in the X axis direction so as to be engaged with the case member 4 from the outside. With the claw portions 34, the case member 4 is fixed to the base member 3. The protrusion 31 to be inserted in the lower end 92 of the coil spring 9 is located between the claw portions 34.

The support portion 35 is also formed to protrude upward from the flange portion 33. The support portion 35 holds the circuit board 2 by sandwiching the circuit board 2 in the X axis direction. Thus, the circuit board 2 is supported by the base member 3.

As illustrated in FIGS. 1 and 2, the case member 4 is located above the base member 3 and covers the circuit board 2. The case member 4 includes a box-shaped portion 41 having a box shape and a cylindrical portion 42 protruding in a cylindrical shape from the box-shaped portion 41. The box-shaped portion 41 and the cylindrical portion 42 are integrally formed. Similar to the base member 3, the case member 4 is made of one or more of various resin materials such as polybutylene terephthalate (PBT), which allows the case member 4 to be easily molded by using a mold when the case member 4 is manufactured. Alternatively, the case member 4 may be made of one or more of various metal materials such as stainless steel.

The box-shaped portion 41 includes a top plate portion 411 and a side wall portion 412 protruding downward from an edge portion of the top plate portion 411. The side wall portion 412 is provided with engagement portions 43 with which the claw portions 34 of the base member 3 are engaged. The case member 4 is fixed to the base member 3 by the claw portions 34 engaged with the engagement portions 43.

Figure 6:
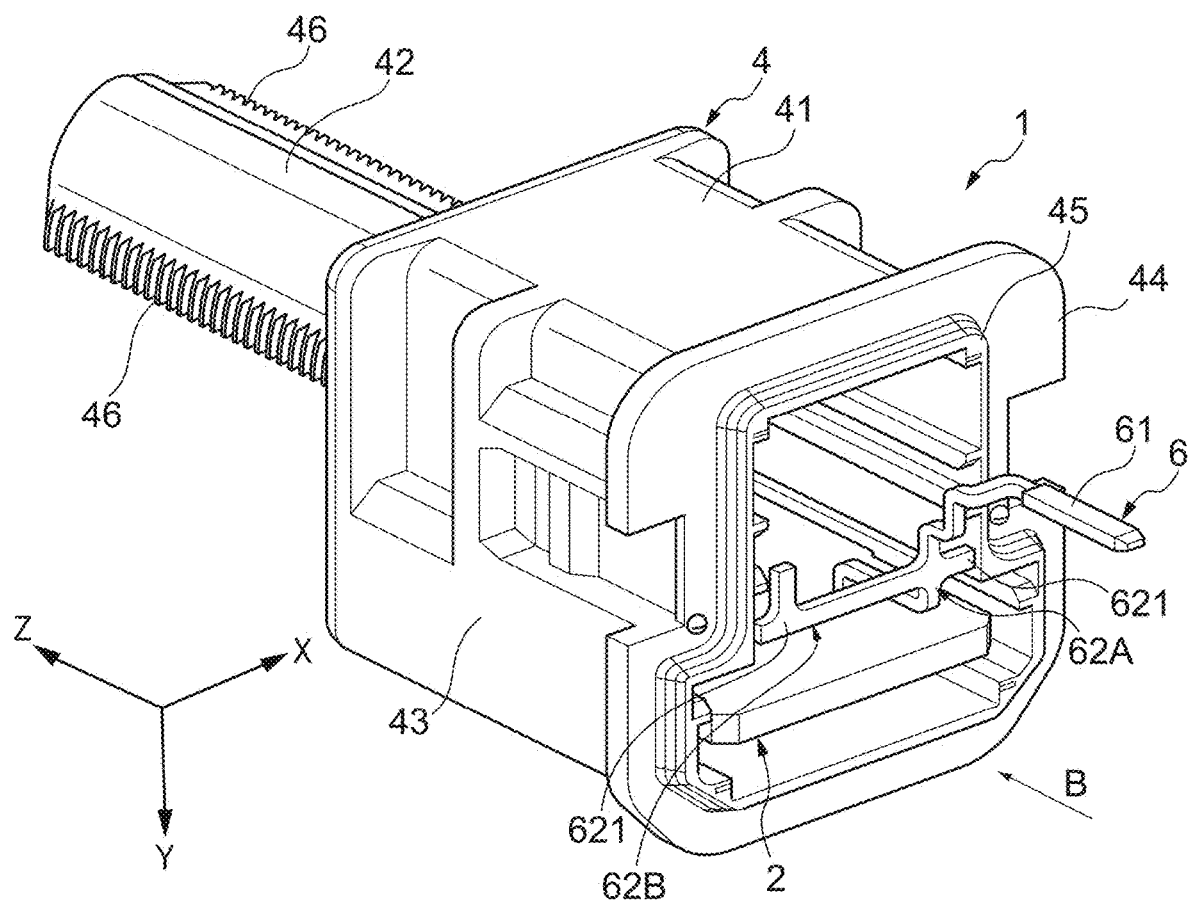
FIG. 6 is a perspective view for illustrating a positional relationship among the circuit board, a case member, and the ground member in the switch device illustrated in FIG. 1.
Figure 7:
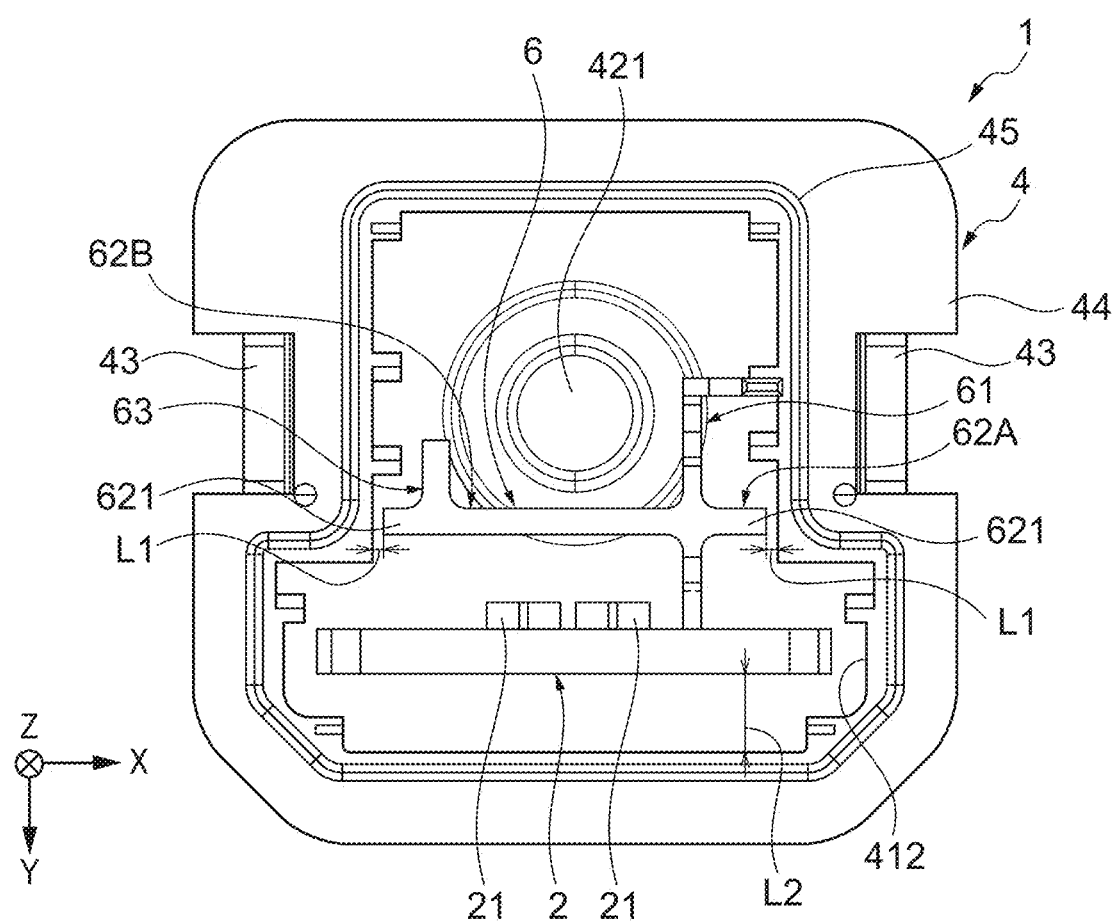
FIG. 7 is a view of the electronic component protection structure as viewed from a direction of an arrow B in FIG. 6.

A flange portion 44 is formed to protrude from an outer periphery of the side wall portion 412. As illustrated in FIGS. 6 and 7, a restricting portion 45 protrudes downward from the flange portion 44. FIG. 7 is a view of the electronic component protection structure 1 as viewed from a direction of an arrow B in FIG. 6. The restricting portion 45 is formed in a shape of a ring or closed curve running along the circumferential direction of the side wall portion 412, and restricts a compression limit of the sealing member 5 when the sealing member 5 is compressed between the flange portion 33 of the base member 3 and the flange portion 44 of the case member 4.

The cylindrical portion 42 having the distal end opening portion 421 protrudes upward from the top plate portion 411 of the box-shaped portion 41. The rod 7 is slidably supported inside the cylindrical portion 42. As a result, the rod 7 is guided by the cylindrical portion 42 and is stably movable in a reciprocating manner in the Z-axis direction. It should be noted that a male screw 46 screwed with an attachment (which is not illustrated) for the switch device 10 is formed on an outer periphery of the cylindrical portion 42, but the male screw 46 may be omitted.

As illustrated in FIG. 2, the sealing member 5 is located between the base member 3 and the case member 4. The sealing member 5 has a shape of a ring or closed curve similar to that of the restricting portion 45 of the case member 4, and is compressed between the flange portion 33 of the base member 3 and the flange portion 44 of the case member 4 as described above. Thus, the sealing member 5 seals between the base member 3 and the case member 4 while being in close contact with the flange portion 33 and the flange portion 44 over the entire circumference of the sealing member 5. As a result, the waterproof property between the base member 3 and the case member 4 is maintained. Accordingly, it is possible to prevent moisture or the like from entering the case member 4, and thus the circuit board 2 is protected.

The restricting portion 45 of the case member 4 is located inside the sealing member 5. The compression limit of the sealing member 5 is regulated by the restricting portion 45 of the case member 4. Accordingly, the sealing member 5 is compressed without excess or deficiency. It should be noted that the sealing member 5 is made of one or more of various rubber materials such as nitrile rubber, urethane rubber, silicone rubber, and fluororubber.

As illustrated in FIG. 4, the ground member 6 is connected to the circuit board 2. The ground member 6 is a ground (GND) line for the circuit board 2, and is made of a conductive material such as a copper alloy.

Figure 5:
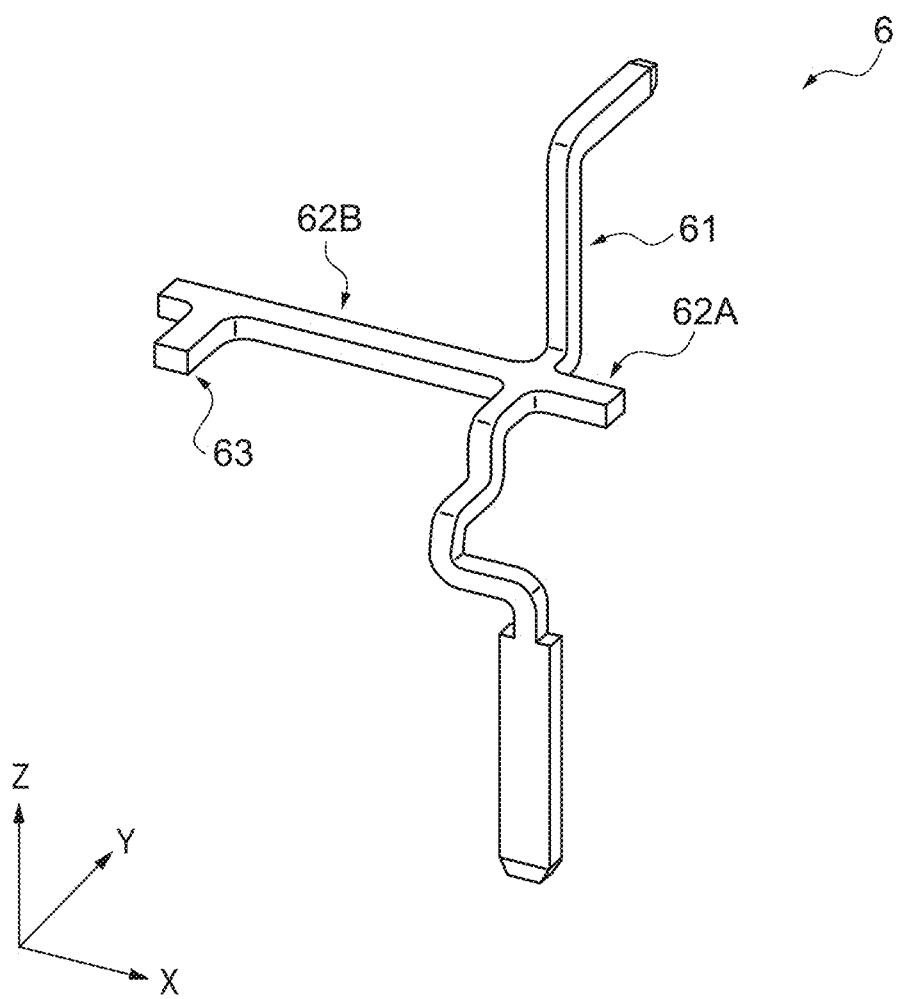
FIG. 5 is a perspective view of the ground member illustrated in FIG. 4.

As illustrated in FIG. 5, the ground member 6 has a linear shape, and includes a linear portion 61 constituting a main body of the ground member 6, and a protruding portion 62A and a protruding portion 62B protruding from the linear portion 61. The linear portion 61 is bent at a plurality of positions on the linear portion 61, the positions being located in the middle of the linear portion 61 in the longitudinal direction of the linear portion 61. The protruding portion 62A branches off and protrudes from one position on the linear portion 61, the position being located in the middle of the linear portion 61 in the longitudinal direction thereof. The protruding portion 62A extends linearly toward the positive side in the X axis direction. The protruding portion 62B branches off and protrudes from one position on the linear portion 61, the position being located in the middle of the linear portion 61 in the longitudinal direction thereof (in the present embodiment, the same position as the protruding portion 62A). The protruding portion 62B extends linearly toward the negative side in the X axis direction. It should be noted that, in the present embodiment, the total length of the protruding portion 62B is longer than the total length of the protruding portion 62A. Further, a protruding portion 63 protruding toward the negative side in the Y axis direction branches off from a position on the protruding portion 62B, located in the middle of the protruding portion 62B in the longitudinal direction thereof. The protruding portion 63 may be omitted.

As illustrated in FIG. 3, at least a distal end portion (at least a part) of each of the protruding portion 62A and the protruding portion 62B corresponds to an exposed portion 621 exposed to the inside (in other words, exposed to the inner space) of the case member 4. As illustrated in FIGS. 6 and 7, each exposed portion 621 protrudes toward the side wall portion 412 of the case member 4. It should be noted that, in FIGS. 6 and 7, terminals 22 connected to the circuit board 2 are omitted.

In the present embodiment, the exposed portion 621 of the protruding portion 62A protrudes toward the side wall portion 412 of the case member 4 on the positive side in the X axis direction, and the exposed portion 621 of the protruding portion 62B protrudes toward the side wall portion 412 of the case member 4 on the negative side in the X axis direction. Due to such protrusion, the shortest distance L1 between each exposed portion 621 and the side wall portion 412 of the case member 4 is made shorter than the shortest distance L2 between the circuit board 2 including the electronic component 21 and the side wall portion 412 of the case member 4 (see FIG. 7). As a result, when the case member 4 is charged, discharge from the case member 4 to the exposed portions 621 occurs in preference to discharge from the case member 4 to the circuit board 2, and the electronic component 21 is protected from static electricity. It should be noted that examples of the cause of the generation of static electricity include rubbing of a foot of a driver of an automobile on a floor mat in a vehicle, and charging of a person himself or herself who is installing or replacing the switch device 10.

As described above, the switch device 10 (electronic component protection structure 1), achieves protection of the electronic component 21 from static electricity charged in the case member 4 with a simple configuration such that at least a part of the ground member 6 is exposed to the inside of the case member 4. The case member 4 does not need to have any discharge member other than the ground member 6. As a result, it is possible to suppress an increase in the number of components constituting the switch device 10 and an increase in size of the switch device 10.

The protruding portion 62B is located on the opposite side of the linear portion 61 from the protruding portion 62A. As a result, the ground member 6 has the two exposed portions 621 on both sides of the linear portion 61, and it is possible to increase the number of discharge portions where discharge from the case member 4 to the ground member 6 occurs. Each exposed portion 621 is separated from the side wall portion 412 of the case member 4. This prevents each exposed portion 621 from hindering the compression of the sealing member 5, so that the sealing member 5 can sufficiently exhibit a waterproof function.

Second Embodiment

A second embodiment will be described with reference to FIGS. 8 and 9.

Figure 8:
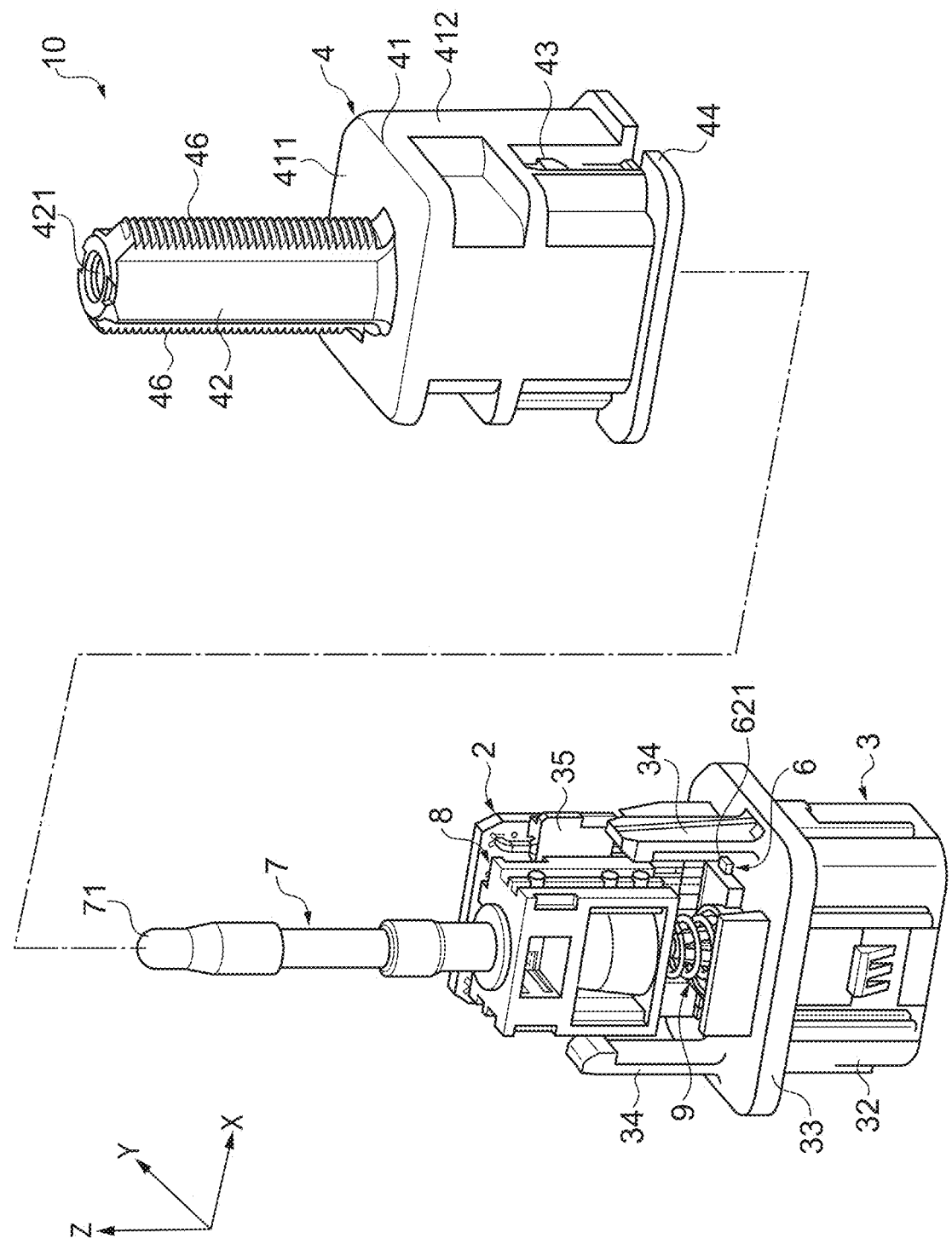
FIG. 8 is an exploded perspective view of a switch device including an electronic component protection structure according to a second embodiment.

As illustrated in FIG. 8, in a switch device 10 (electronic component protection structure 1) according to the present embodiment, the sealing member 5 is omitted, unlike the switch device 10 (electronic component protection structure 1) according to the first embodiment. The switch device 10 is usable in a case where waterproofness is not needed.

Figure 9:
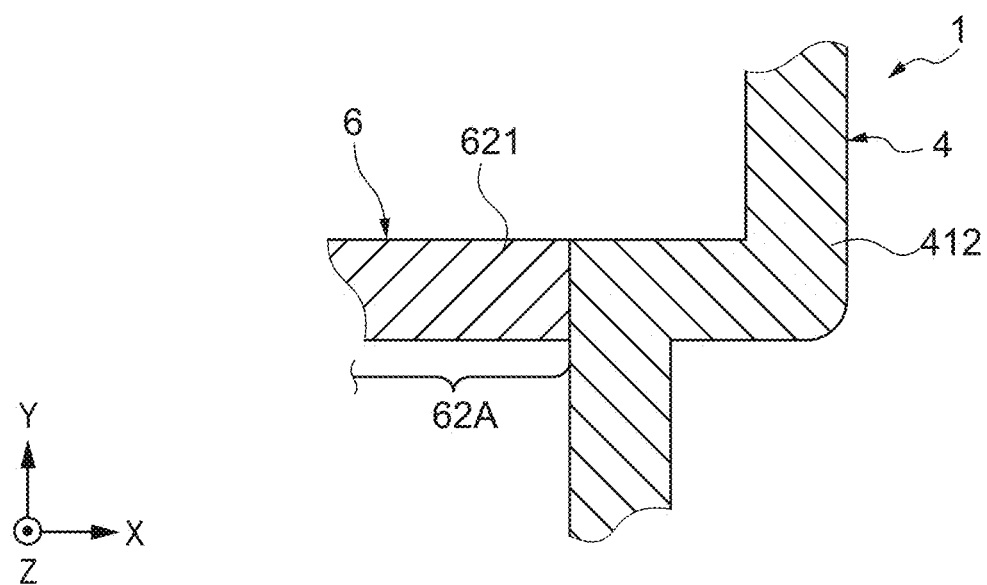
FIG. 9 is a partial schematic cross-sectional view for illustrating a positional relationship between a case member and a ground member in the switch device illustrated in FIG. 8.

When the waterproof property is not needed, as illustrated in FIG. 9, in a ground member 6, an exposed portion 621 of a protruding portion 62A may be in contact (specifically, in direct contact) with a side wall portion 412 of a case member 4. The same applies to an exposed portion 621 of a protruding portion 62B. This is because each exposed portion 621 does not hinder the compression of the sealing member 5. Since each exposed portion 621 is in contact with the side wall portion 412, when the case member 4 is charged, discharge from the case member 4 to the exposed portion 621 occurs more preferentially than discharge from the case member 4 to a circuit board 2. As a result, an electronic component 21 is more sufficiently protected from static electricity.

It should be noted that each exposed portion 621 may penetrate the side wall portion 412 and protrude outward while being in direct contact with the side wall portion 412. In addition, each exposed portion 621 is not limited to being in contact with the side wall portion 412, and may be separated from the side wall portion 412 as in the first embodiment.

Third Embodiment

Figure 10:
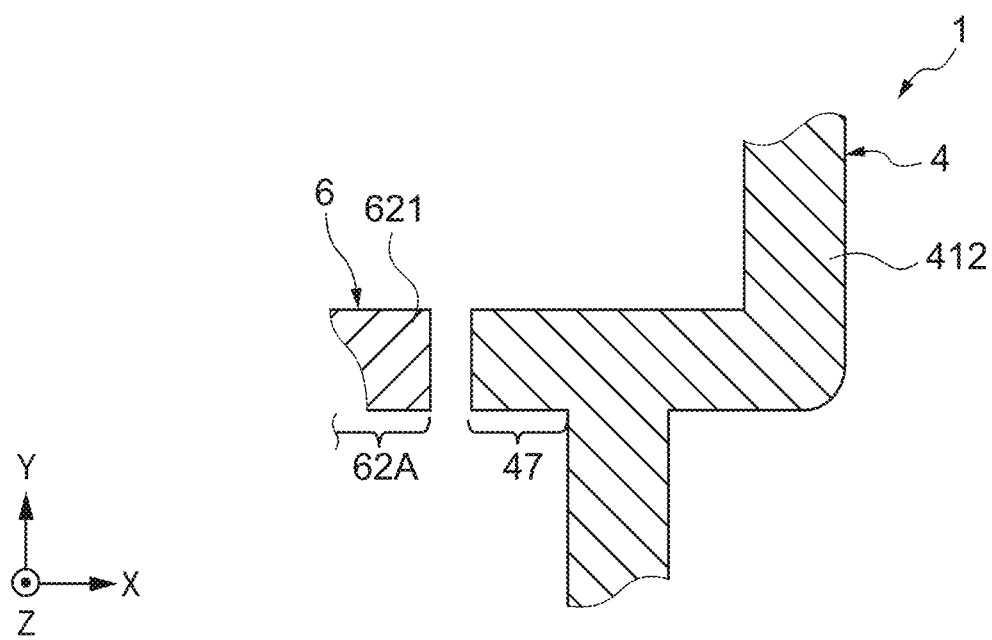
FIG. 10 is a partial schematic cross-sectional view for illustrating a positional relationship between a case member and a ground member in an electronic component protection structure according to a third embodiment.

A third embodiment will be described below with reference to FIG. 10. As illustrated in FIG. 10, in the present embodiment, a case member 4 has, on a side wall portion 412, a case-side protruding portion 47 protruding toward an exposed portion 621 of a protruding portion 62A. The same applies to the protruding portion 62B side. The case-side protruding portions 47 are separated from the exposed portions 621. Further, the configuration of the present embodiment can be included in each of the switch devices 10 (electronic component protection structures 1) according to the first embodiment and the second embodiment. As a result, the distances to the exposed portions 621 can be made shorter than the distances in the first embodiment and the second embodiment, which contributes to preferential discharge from the case member 4 to the exposed portions 621.

Variation of Third Embodiment

Figure 11:
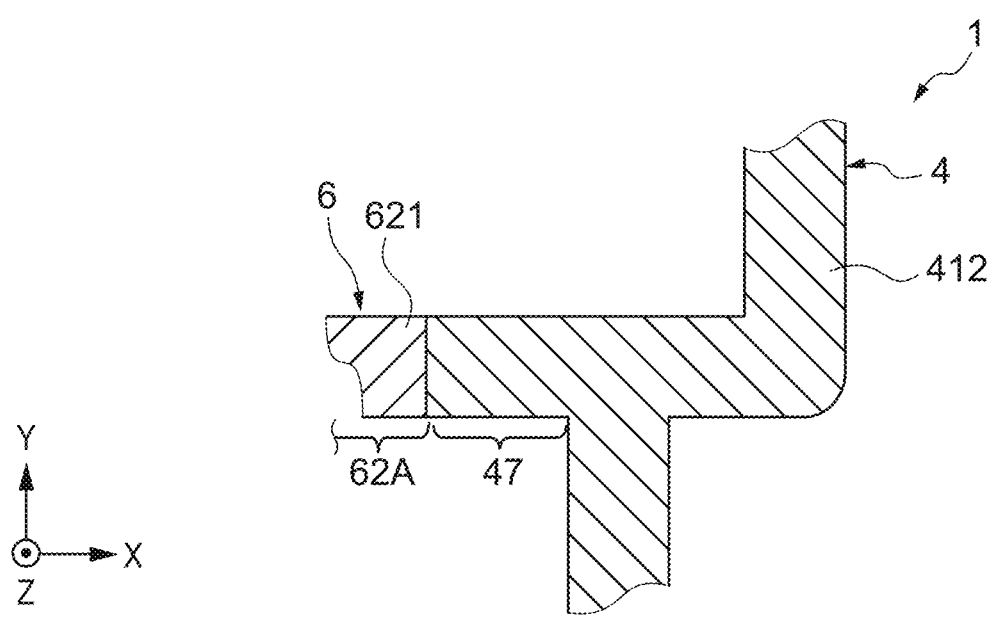
FIG. 11 is a partial schematic cross-sectional view illustrating a variation of the electronic component protection structure according to the third embodiment.

A variation of the third embodiment will be described with reference to FIG. 11. As illustrated in FIG. 11, in the present variation, the case-side protruding portions 47 are in contact with the exposed portions 621. The configuration according to the present variation can be included in each of the switch devices 10 (electronic component protection structures 1) according to the first embodiment and the second embodiment. As a result, the distances to the exposed portions 621 can be made shorter than the distances in the third embodiment, which contributes to preferential discharge from the case member 4 to the exposed portions 621. Even when the configuration according to the present variation is included in the switch device 10 according to the first embodiment, the case member 4 is in contact with the exposed portions 621 via the case-side protruding portions 47, so that the exposed portions 621 can be prevented from hindering the compression of the sealing member 5.

Although the preferred embodiments of the present invention have been described above, the present invention is not limited to the above-described embodiments, and various variations and changes can be made within the scope of the gist of the present invention. The electronic component protection structure 1 is included in the switch device 10 in each embodiment as an example, but alternatively, the electronic component protection structure 1 can be included in any other various electronic devices.

This application claims the benefit of Japanese Patent Application No. 2022-037110 filed on Mar. 10, 2022 which is hereby incorporated by reference herein in its entirety.

What is claimed is:

1. An electronic component protection structure comprising:
   a circuit board on which an electronic component is mounted;
   a base member supporting the circuit board;
   a case member covering the circuit board and fixed to the base member; and
   a conductive ground member connected to the circuit board,
   wherein the ground member includes an exposed portion at least a part of which is exposed to an inside of the case member,
   wherein the ground member includes a linear portion and a protruding portion branching off and protruding from a position on the linear portion, the position located in a middle of the linear portion in a longitudinal direction of the linear portion, and
   at least an end of the protruding portion is exposed to the inside of the case member as the exposed portion.

2. The electronic component protection structure according to claim 1,
   wherein the ground member further includes another protruding portion branching off and protruding from a position on the linear portion, the position located in a middle of the linear portion in the longitudinal direction,
   at least an end of the another protruding portion is exposed to the inside of the case member as the exposed portion, and
   the another protruding portion is located on an opposite side of the linear portion from the protruding portion.

3. The electronic component protection structure according to claim 1, wherein the exposed portion protrudes toward the case member.

4. The electronic component protection structure according to claim 1, wherein a shortest distance between the exposed portion and the case member is shorter than a shortest distance between the circuit board and the case member.

5. The electronic component protection structure according to claim 4, wherein the exposed portion is separated from the case member.

6. The electronic component protection structure according to claim 5, further comprising
   a sealing member located between the base member and the case member to seal between the base member and the case member.

7. The electronic component protection structure according to claim 4, wherein the exposed portion is in contact with the case member.

8. The electronic component protection structure according to claim 1, wherein the case member includes a case-side protruding portion protruding toward the exposed portion.

9. The electronic component protection structure according to claim 1, wherein the case member is made of a resin material.

10. A switch device comprising:
an operation body being movable in a reciprocating manner in at least one direction; and
an electronic component protection structure including:
- a circuit board on which an electronic component configured to detect movement of the operation body and output a detection result is mounted;
- a base member supporting the circuit board;
- a case member covering the circuit board and fixed to the base member; and
- a conductive ground member connected to the circuit board, wherein the ground member includes an exposed portion at least a part of which is exposed to an inside of the case member,
wherein the ground member includes a linear portion and a protruding portion branching off and protruding from a position on the linear portion, the position located in a middle of the linear portion in a longitudinal direction of the linear portion, and
at least an end of the protruding portion is exposed to the inside of the case member as the exposed portion.

* * * * *